United States Patent
Takeshima

(10) Patent No.: US 6,236,243 B1
(45) Date of Patent: May 22, 2001

(54) NEGATIVE VOLTAGE LEVEL DETECTION CIRCUIT

(75) Inventor: Toshio Takeshima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/291,319

(22) Filed: Apr. 15, 1999

(30) Foreign Application Priority Data

Apr. 28, 1998 (JP) .................................................. 10-117653

(51) Int. Cl.⁷ .................................................. H03K 5/153
(52) U.S. Cl. .............................. 327/88; 327/89; 327/563; 330/253
(58) Field of Search .................................. 327/77, 88, 89, 327/563; 330/252, 253

(56) References Cited

U.S. PATENT DOCUMENTS 5,194,762 * 5/1997 Hara et al. ............................. 327/434
5,627,493 * 5/1997 Takeuchi et al. ...................... 327/525

FOREIGN PATENT DOCUMENTS 63-70609    3/1988  (JP) .
5-175801    7/1993  (JP) .
6-68690     3/1994  (JP) .
8-237103    9/1996  (JP) .

* cited by examiner

Primary Examiner—Kenneth B. Wells
(74) Attorney, Agent, or Firm—McGinn & Gibb, PLLC

(57) ABSTRACT

A level detector enables high speed operation at low voltage with eliminating dependency to fluctuation of a power source voltage and tolerance in a device, and further permits stable operation. The level detecting circuit performs predetermined level shifting of a voltage level of an input signal input from a load voltage generating circuit, with a resistance type potential division by a voltage dividing resistor element using a reference power source voltage independent of a power source voltage to be supplied to own circuit. In this case, a differential amplifier feeds an output depending upon a difference between a level shifted signal from the level shifter and a predetermined reference voltage for leading an output thereof as a detection output. Also, since the reference power source independent of the power source voltage is used, influence of fluctuation of the power source voltage for the circuit is restricted to realize stable operation.

15 Claims, 4 Drawing Sheets

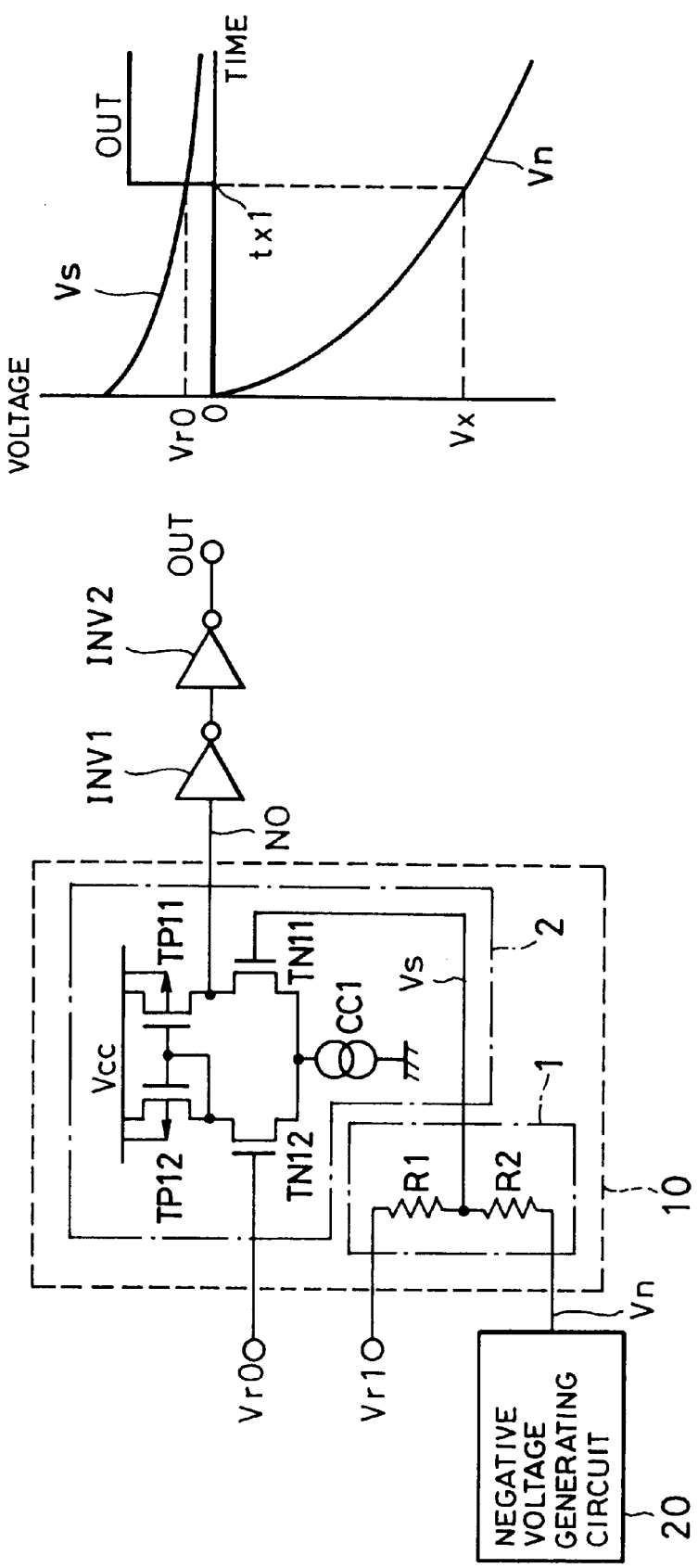

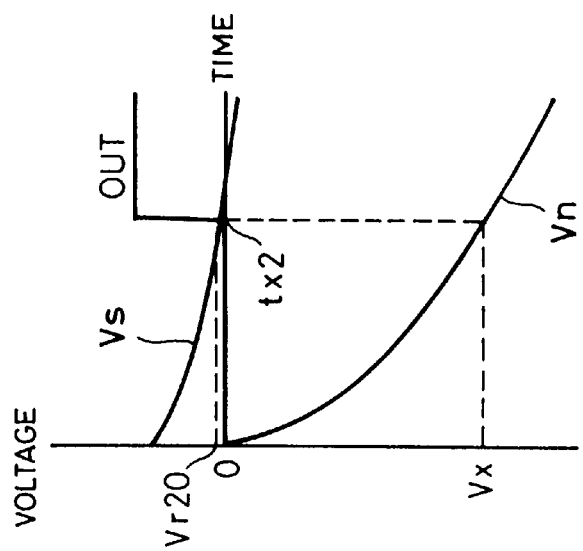
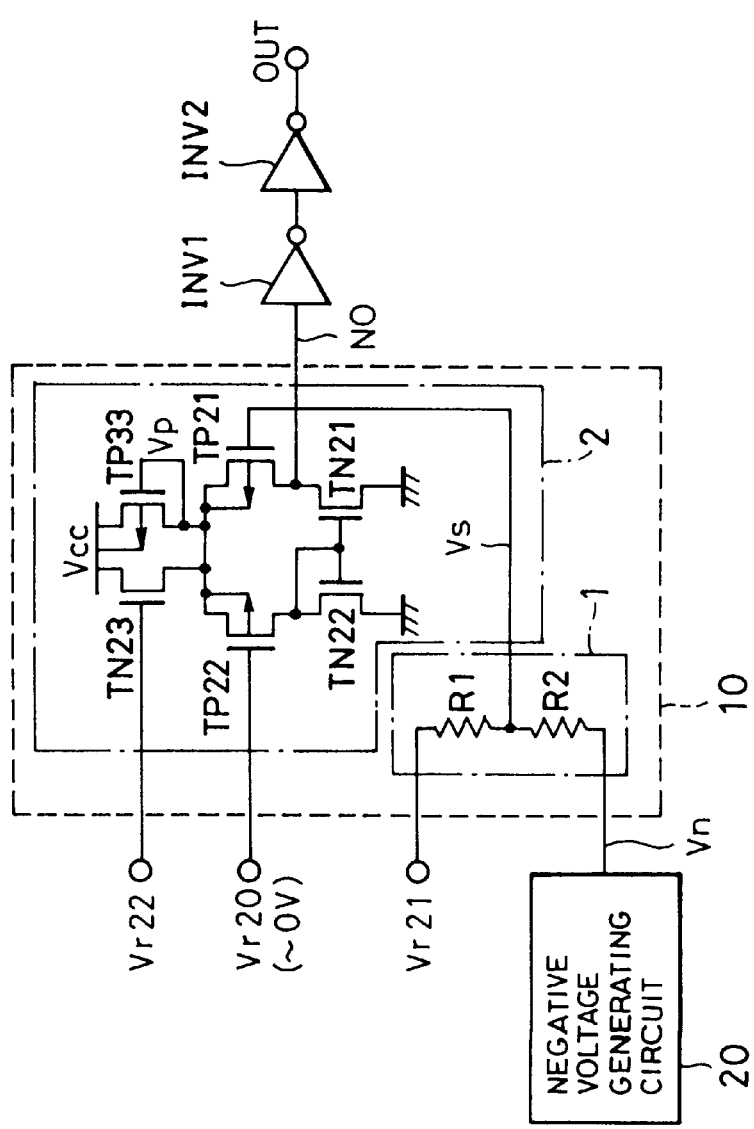
FIG. 3A
FIG. 3B

NEGATIVE VOLTAGE LEVEL DETECTION CIRCUIT

BACKGROUND OF THE INVENTION

1. Field of the Invention

The present invention relates generally to a level detecting circuit. More particularly, the invention relates to a negative voltage level detecting circuit to be used for writing operation or erasure operation for a flash memory.

2. Description of the Related Art

In writing operation or erasure operation for a flash memory as a non-volatile memory, it is becoming a trend to use a negative voltage in combination with a positive voltage in order to realize operation at low potential. In a transformer circuit for generating the negative voltage to be used for such purpose, it is important to stably control the output voltage thereof in a wide power source voltage range.

One example of the conventional negative voltage level detecting circuit to be used for such control has been disclosed in Japanese Unexamined Patent Publication No. Heisei 6-68690. Such a circuit will be briefly discussed with reference to FIGS. 4A and 4B.

In FIG. 4A, a level detecting circuit 10 is constructed with a level shifter 1 for inputting a voltage Vn from a negative voltage generating circuit, and a signal amplifier portion 2 for switching a voltage level at a node N0 depending upon an output of the level shifter 1.

The level shifter 1 shown in FIG. 4A is constructed with including a MOSFET (Metal Oxide Semiconductor Field Effect Transistor) TN2, p-MOSFET TP2 and p-MOSFET TP3.

On the other hand, the signal amplifier portion 2 is constructed with p-MOSFET TP1 and n-MOSFET N1. The signal amplifier portion 2 receives the output of the level shifter 1 and detects that the voltage Vn is lowered in order to be lower than a desired voltage level Vx (namely, voltage Vn≦Vx) (time tx) to switch the voltage at the node N0 from a high level (substantially equal value to a power source voltage Vcc) of a binary signal to a low level (approximately 0V).

The voltage appearing at the node N0 is normally input to a logic gate such as an inverter INV or the like for wave shaping and is transformed into a complete CMOS (Complementary Metal Oxide Semiconductor) logic level signal. This logic level signal is illustrated as signal OUT in FIG. 4B.

On the other hand, in FIG. 4B, when the voltage Vn>Vx, a drain-source voltage of the n-MOSFET TN2 becomes sufficiently high to turn ON the n-MOSFET TN1, ON-resistance of the p-MOSFET TP1 becomes smaller than ON-resistance of the n-MOSFET N1. Therefore, the voltage of the node N0 becomes high level (signal OUT is GND level). On the other hand, when voltage Vn≦Vx is established, the drain-source voltage of the n-MOSFET TN2 becomes sufficiently high to turn ON the n-MOSFET TN1, ON-resistance of the n-MOSFET TN1 becomes smaller than ON-resistance of the p-MOSFET TP1. Therefore, the voltage of the node N0 becomes low level (signal OUT is the power source voltage Vcc level).

In the foregoing circuit, voltage level detection (detection signal generation) is performed with ON-resistance ratio of the n-type MOSFET and the p-type MOSFET, and a voltage amplification degree of the signal amplifier portion 2 is low. Therefore, output (voltage at the node N0) inverting operation of the signal amplifier portion 2 is slow to slow-down the operation speed. On the other hand, a problem is encountered in that an inverting period (tx) significantly depends on fluctuation of the power source voltage or device characteristics.

It should be noted that Japanese Unexamined Patent Publication No. Heisei 5-175801 also discloses a circuit including the level shifter and the signal amplifier portion. However, in the circuit disclosed in the above-identified publication, it concerns the power source voltage level (positive voltage) to be supplied to a memory chip. The foregoing drawback is directed to a problem in that the voltage level (negative voltage) generated within the memory chip by the transformer circuit. Accordingly, in the content of disclosure of the above-identified publication, the foregoing problem cannot be solved.

SUMMARY OF THE INVENTION

The present invention has been worked out for solving the drawbacks in the prior art as set forth above. Therefore, it is an object of the present invention to provide a level detecting circuit which can operate stably at high speed and low voltage irrespective of fluctuation of power source voltage and tolerance in the device, in output level detection of a transformer circuit for generating a negative voltage to be used for a flash memory or so forth.

In order to accomplish the above-mentioned and other objects, a level detecting circuit, according to one aspect of the present invention, comprises:

level shifting means for performing predetermined level shifting of a voltage level of an input signal input from a load voltage generating circuit, with a resistance type potential division by a voltage dividing resistor element using a reference power source voltage independent of a power source voltage to be supplied to own circuit, and differential amplifier feeding an output depending upon a difference between a level shifted signal from the level shifter and a predetermined reference voltage for leading an output thereof as a detection output.

In the preferred construction, the voltage dividing resistor elements in the level shifting signal may be connected in series between the reference power source voltage independent of the power source voltage to be supplied to own circuit, and the level shifted signal may be led from one end of the series connected resistor elements. The level shifting means may perform level shifting of the input signal so that a voltage level of the input signal becomes the predetermined reference voltage at a predetermined voltage level.

On the other hand, the differential amplifier may include a pair of transistors forming a differential pair and a current mirror circuit to be a load for the pair of transistors, and the detection output may be lead from a junction between the transistors and the current mirror circuit. In this case, the differential amplifier may further include a constant current source, and the pair of transistors may be provided between the constant current source and the current mirror circuit.

The differential amplifier may have a transistor to be a constant current source to be controlled to ON condition by a constant voltage independent of the power source voltage supplied to the own circuit, the pair of transistors may be provided between the transistor and the current mirror circuit.

The level detecting circuit may further comprise another transistor which is turned ON depending upon the output of the transistor, in parallel to the transistor. The predetermined reference voltage may be equal to a grounding potential.

The level detecting circuit may further comprise a logical level transforming means for transforming the detection output into a CMOS logic level signal. The logic level transforming means may be an inverter circuit constructed with a CMOS logic circuit.

The voltage dividing resistor element may be formed of a polycrystalline silicon. In the alternative, the voltage dividing resistor element may be formed with a combination of MOSFETs.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 1A is a block diagram showing a construction of the first embodiment of a level detecting circuit according to the present invention;

FIG. 1B is a waveform chart showing operation of the first embodiment of the level detecting circuit of FIG. 1A;

FIG. 3A is a block diagram showing a construction of the third embodiment of a level detecting circuit according to the present invention;

FIG. 3B is a waveform chart showing operation of the third embodiment of the level detecting circuit of FIG. 3A;

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 4B:
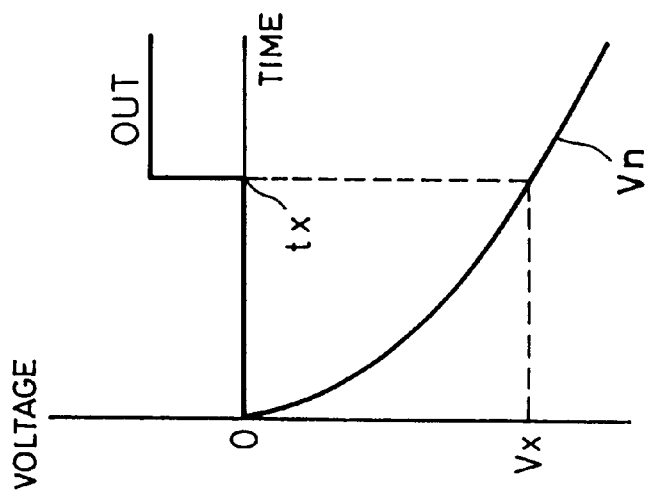
FIG. 4B is a waveform chart showing operation of the conventional level detecting circuit of FIG. 4A.
Figure 4A:
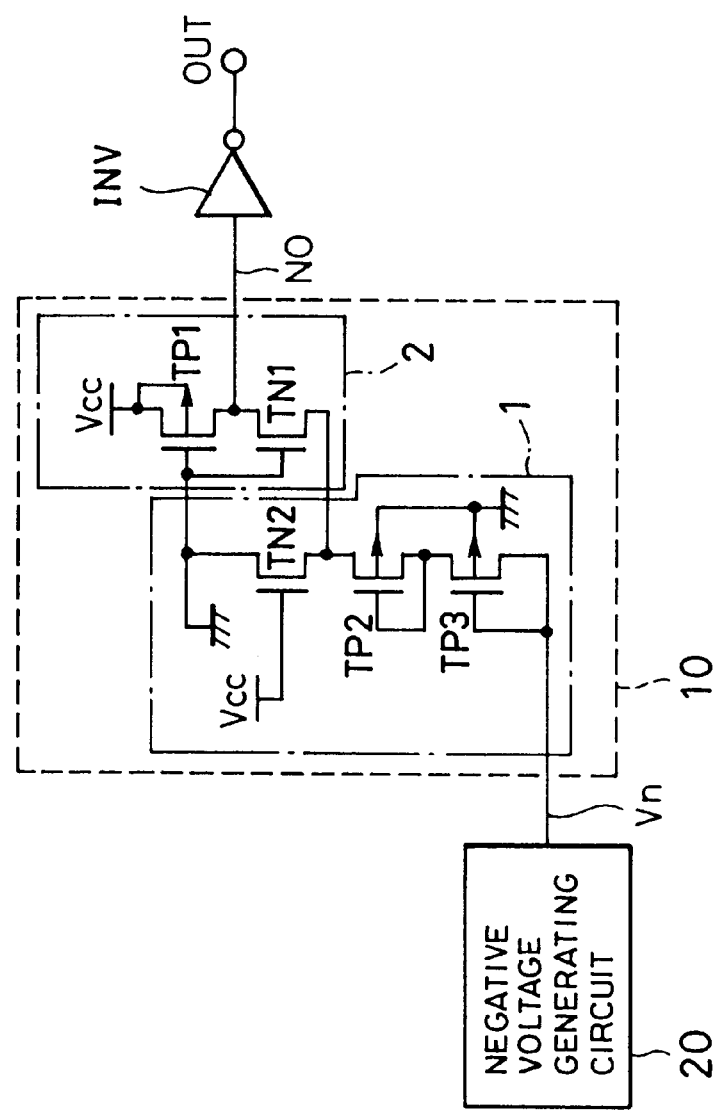
FIG. 4A is a block diagram showing a construction of the conventional level detecting circuit.

FIG. 1A is a block diagram showing the first embodiment of a level detecting circuit according to the present invention. In FIG. 1A, elements like those in FIG. 4A are identified by the same reference numerals. In FIG. 1A, the first embodiment of the level detecting circuit 10 according to the present invention is constructed with including a level shifter 1 which performs predetermined level shifting of the voltage level of the input signal input from the negative voltage generating circuit 20 by a resistance type potential division by voltage dividing resistors, and the signal amplifier circuit 2 feeding an output depending upon a difference between a level shifted signal and a predetermined reference voltage. Then, the signal amplifier portion 2 has a differential amplifier having a pair of transistors forming a differential pair and a current mirror circuit to be a load for the pair of transistors. Then, the output of the differential amplifier is lead as a detection output.

The voltage dividing resistors in the level shifter 1 is connected in series between a reference power source voltage which does not have dependency to the power source voltage to be supplied to the own circuit and the input signal. The level shifted signal is lead from one end of the resistors. On the other hand, the level shifter 1 causes level shifting of the input signal so that the voltage level of the input signal becomes a predetermined reference voltage when it is in a predetermined voltage level.

Discussion will be given hereinafter for the first to third embodiments of the level detecting circuit according to the present invention.

At first, a circuit construction of the first embodiment of the level detecting circuit according to the present invention is illustrated in FIG. 1A and waveforms in various parts showing operation of the first embodiment of the level detecting circuit is illustrated in FIG. 1B. The level detecting circuit 10 shown in FIG. 1A is constructed with the level shifter 1 which is constructed with resistors R1 and R2 which takes voltage Vn (<0V) being output of the negative voltage generating circuit, as input, and a current mirror type differential amplifier which receives the output of the level shifter 1, detects that the voltage Vn is lowered to be lower than the predetermined voltage level Vx (Vn≦Vx) (time tx1), switches the binary signal of the node N0 from low level (approximately 0V) to high level (substantially equal value to the power source voltage Vcc), and is constructed with p-MOSFET TP11, p-MOSFET TP12, n-MOSFET TN11, n-MOSFET TN12 and a constant current source CC1.

Namely, the level shifter 1 outputs a signal Vs to be equal to a reference voltage Vr0 when the negative voltage input voltage Vn is a predetermined voltage level Vx using a reference power source voltage Vr1. On the other hand, the differential amplifier is applied the signal Vs output from the level shifter 1 and the reference voltage Vr0 to gates of the n-MOSFET TN11 and the n-MOSFET TN12 serving as input terminals to operate two MOSFETs, i.e. p-MOSFET TP11 and p-MOSFET TP12, as current mirror type loads. Then, an output signal is obtained at the node N0 from the drain terminal of the n-MOSFET TN11. It should be noted that the reference voltages Vr0 and Vr1 have no dependency to the power source voltage Vcc to be supplied to the own circuit.

In the construction set forth above, the output signal (output voltage of the node N0) is normally input to the logic gate of inverters INV1, INV2 or so forth, for wave shaping, and is transformed into a complete CMOS logic level signal. This CMOS logic level signal is signal OUT in the drawing.

Here, by setting the value of the resistance of the level shifter 1 as $R2/R1=(Vr0-Vx)/(Vr1-Vr0)$, when voltage Vn>Vx, voltage Vs>Vr0 is established. The voltage at the node N0 becomes low level (signal OUT is GND level). On the other hand, when the voltage Vn≦Vx, the voltage Vs≦Vr0 is established. Then, the voltage at the node N0 becomes high level (signal OUT becomes Vcc level). It should be noted that the voltages Vr0 and Vr1 are constant voltages having no dependency to the power source voltage Vcc, and are values satisfying Vr1>Vr0>Vtn.

In the shown embodiment, level detection of the output signal Vs of the level shifter 1 is performed employing the current mirror type amplifier taking the gates of two MOSFETs, i.e. n-MOSFET TN11 and n-MOSFET TN12 as differential signal input terminals. Therefore, voltage amplification degree of the signal amplifier 2 is high. On the other hand, dependency to fluctuation of the device characteristics can be made small. Also, since the reference power source Vr1 is used in the level shifter 1, dependency of the level shifting operation to the power source voltage Vcc is eliminated.

Namely, output (voltage of the node N0) inverting operation of the signal amplifier portion 2 becomes fast. Also, dependency of the power source voltage (Vcc) or fluctuation of the device characteristics upon inverting timing (tx1) becomes low.

Figure 2B:
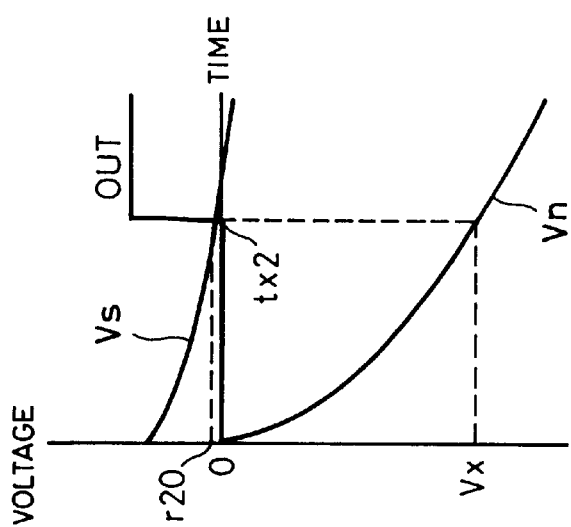
FIG. 2B is a waveform chart showing operation of the second embodiment of the level detecting circuit of FIG. 2A.
Figure 2A:
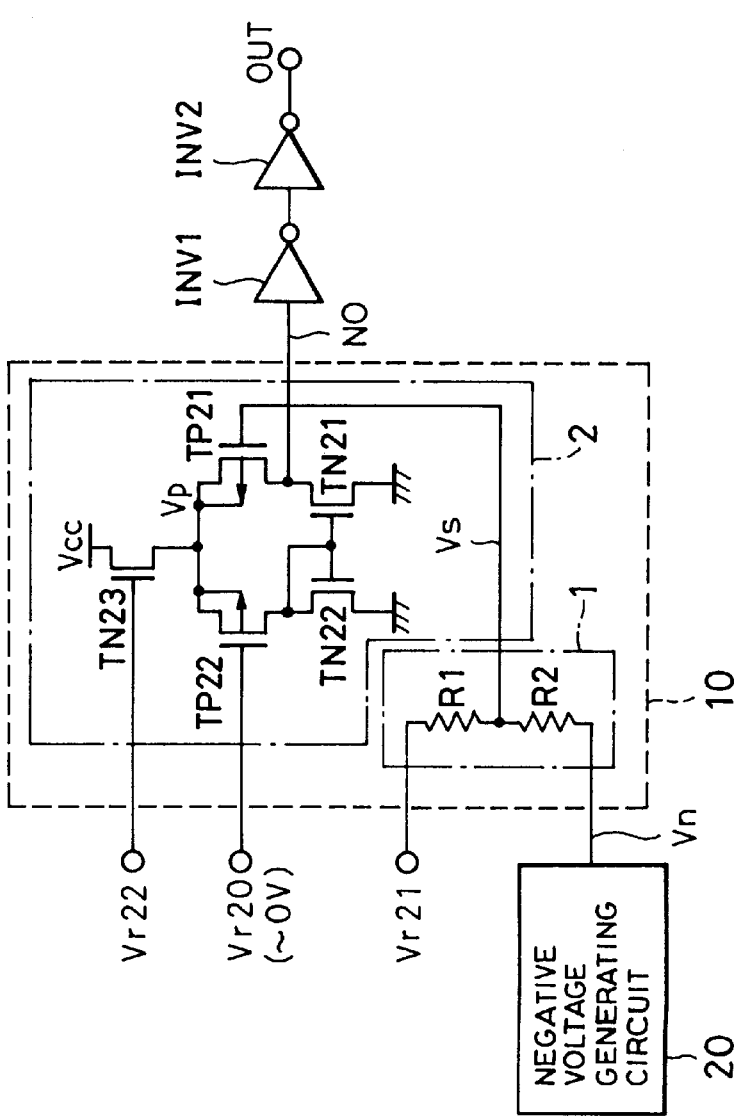
FIG. 2A is a block diagram showing a construction of the second embodiment of a level detecting circuit according to the present invention.

The circuit construction of the second embodiment of the level detecting circuit according to the present invention is illustrated in FIG. 2A and the waveshape showing operations of various parts of the second embodiment of the level detecting circuit is illustrated in FIG. 2B. The level detecting circuit 10 shown in FIG. 2A is constructed with a level shifter 1 formed with the resistors R1 and R2 taking voltages Vn (<0V) being output of the negative voltage generating circuit as input, and the current mirror type differential amplifier which receives the output of the level shifter 1, detects the voltage Vn of the output of the level shifter 1 lowered to be lower than a predetermined voltage Vx (Vn≦Vx) (time tx2), and constructed with p-MOSFET TP21, p-MOSFET TP22, n-MOSFET TN21, n-MOSFET TN22 and n-MOSFET TN23 for supplying a constant current/constant voltage for switching the binary signal of the node N0 from the low level (approximately 0V) to a high level (approximately Vp).

Namely, the level shifter 1 is adapted to output a signal Vs to be equal to a reference voltage Vr20 (may also be 0V) when the negative voltage input Vn is a predetermined level Vx using the reference power source Vr21. On the other hand, the differential amplifier is applied the signal Vs output from the level shifter 1 and the reference voltage Vr20 to the gates of the p-MOSFET TP21 and the p-MOSFET TP22 to operate two MOSFETs, i.e. the n-MOSFET TN21 and the n-MOSFET TN22 as current mirror type loads. Furthermore, a reference voltage Vr22 is applied to the gate. The n-MOSFET TN23 supplies constant voltage/current to sources of two MOSFETs, i.e. the p-MOSFET TP21 and the p-MOSFET TP22. Then, an output signal from the drain terminal of the p-MOSFET TP21 to the node N0 is obtained. It should be noted that the voltages Vr20, Vr21 and Vr22 do not have dependency to the power source voltage Vcc.

In the construction set forth above, the output signal (output voltage of the node N0) is normally input to the logic gate of inverters INV1, INV2 or so forth, for wave shaping, and is transformed into a complete CMOS logic level signal. This CMOS logic level signal is signal OUT in the drawing.

Here, by setting the value of the resistance of the level shifter 1 as $$R2/R1=(Vr20-Vx)/(Vr21-Vr20),$$

when voltage Vn>Vx, voltage Vs>Vr20 is established. The voltage at the node N0 becomes low level (signal OUT is GND level). On the other hand, when the voltage Vn≦Vx, the voltage Vs≦Vr20 is established. Then, the voltage at the node N0 becomes high level (signal OUT becomes Vp level). It should be noted that the voltages Vr20, Vr21 and Vr22 are constant voltages having no dependency to the power source voltage Vcc and are values satisfying Vr21>Vr20, Vr22>Vr20+Vtn+Vtp. On the other hand, the voltages Vtn and Vtp are threshold voltages of the n-MOSFET TN23 and p-MOSFET TP22.

It should be noted that the foregoing Vr20 is desirable to be 0V (grounding potential). This is because that dependency on the power source voltage becomes lower as closer to 0V.

In the shown embodiment, level detection of the output signal Vs of the level shifter 1 is performed employing the current mirror type differential amplifier taking the gates of two MOSFETs, i.e. p-MOSFET TP21 and p-MOSFET TP22 as differential signal input terminals. Therefore, voltage amplification degree of the signal amplifier 2 is high. On the other hand, dependency to fluctuation of the device characteristics can be made small. The reference voltage Vr20 can be set 0V. Also, since the reference power source Vr21 is used in the level shifter 1, dependency of the level shifting operation to the power source voltage Vcc is eliminated.

Namely, output (voltage of the node N0) inverting operation of the signal amplifier portion 2 becomes fast. Also, dependency of the power source voltage (Vcc) or fluctuation of the device characteristics upon inverting timing (tx2) becomes low. Furthermore, operation at low voltage is permitted. Also, since constant voltage/current is supplied using the n-MOSFET TN23 in place of the constant current source CC1 used in the first embodiment, circuit construction becomes simple to facilitate integration to a semiconductor chip.

The circuit construction of the third embodiment of the level detecting circuit according to the present invention is illustrated in FIG. 3A and the waveshape showing operations of various parts of the third embodiment of the level detecting circuit is illustrated in FIG. 3B.

Here, the level shifter 1 outputs the signal Vs to be equal to the reference voltage Vr20 (may also be 0V) when the negative voltage input Vn is the desired level Vx using the reference power source Vr21. On the other hand, the differential amplifier applies the signal Vs output from the level shifter 1 and the reference voltage Vr20 to the gates of two MOSFETs, i.e. the p-MOSFET TP21 and the p-MOSFET TP22, as input terminals and operates two MOSFETs, i.e. the n-MOSFET TN21 and the n-MOSFET TN22 as current mirror type loads. The differential amplifier also includes the n-MOSFET TN23 applied reference voltage Vr22 to the gate and supplying the constant voltage/current to sources of two p-MOSFETs, and a p-MOSFET TP33 for a constant current source arranged in parallel to the n-MOSFET TN23. Then, an output signal from the drain terminal of the p-MOSFET TP21 to the node N0 is obtained. It should be noted that the voltages Vr20, Vr20, Vr22 do not have dependency to the power source voltage Vcc.

In the second embodiment set forth above, the voltage Vp is constant at a level of the voltage Vr22−Vtn. Therefore, as optimized at a region where the power source voltage Vcc is low, operation at a region where the power source voltage Vcc is high, becomes impossible. When the power source voltage Vcc becomes high, the logical threshold value of the inverters INV1, INV2 or so forth becomes high to erroneously recognize high level Vp of the node N0 as low level. In the shown embodiment, this problem has been resolved as follow.

Namely, in parallel to the n-MOSFET TN23 for supplying constant current/constant voltage determining the high level (approximately Vp) of the binary signal of the node N0, the p-MOSFET TP33 for constant current source is added. By this, the voltage Vp has slight dependency to the power source voltage Vcc, high level of the node N0 becomes slightly high. Therefore, wide operation range of the power source voltage Vcc of the level detecting circuit can be provided.

In the shown embodiment, level detection of the output signal Vs of the level shifter 1 is performed using the current mirror type differential amplifier taking the gates of two MOSFETS, i.e. the p-MOSFET TP21 and the p-MOSFET TP22 as differential signal input terminals. Therefore, voltage amplification degree of the signal amplifier portion 2 is high. Also, dependency on fluctuation of the device characteristics can be made small, and the reference voltage Vr20 can be made 0V. Furthermore, since the reference power source Vr21 is employed in the level shifter 1, dependency on the power source voltage Vcc in the level shifting operation can be eliminated. Since the p-MOSFET TP33 for the constant current source having slight dependency on the power source voltage Vcc is provided in parallel to the n-MOSFET TN23, wide range power source operation becomes possible.

Namely, output (voltage of the node N0) inverting operation of the signal amplifier portion 2 becomes fast. Also, dependency of the power source voltage (Vcc) or fluctuation of the device characteristics upon inverting timing (tx2) becomes low. Furthermore, operation at low voltage and wide range power source operation are permitted. Also, since constant voltage/current is supplied using the n-MOSFET TN23 in place of the constant current source CC1 used in the first embodiment, circuit construction becomes simple to facilitate integration to a semiconductor chip. Furthermore, by adding the p-MOSFET TP33 for constant current source in parallel to the n-MOSFET TN23, the operation range of the level detecting circuit can be set wide.

It should be noted that when the level detecting circuit is integrated in the semiconductor chip, the resistors may be formed with known polycrystalline silicon. Also, the resistor may be formed by combination of a plurality of MOSFETs. Namely, wide variation of resistor elements which can be formed on the semiconductor chip, are applicable.

As set forth above, since the present invention performs predetermined level shifting of the voltage level of the input signal by resistance type potential division using the reference power source not depending on the power source voltage, output inverting operation of the signal becomes fast. Also, dependency of fluctuation of the power source voltage or fluctuation of the device characteristics upon inverting timing becomes low. Furthermore, in place of the constant current source, the constant voltage/current is supplied using the transistor, circuit construction can be made simple. Furthermore, in parallel to the transistor supplying the constant voltage/current, another constant current source transistor which is turned ON depending upon the output of the former transistor, wide operation range can be provided.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A level detecting circuit comprising:
   level shifting means for performing predetermined level shifting of a voltage level of an input signal input from a negative voltage generating circuit, with a resistance type potential division by voltage dividing resistor elements using a reference power source voltage independent of a power source voltage to be supplied to said negative voltage level detection circuit, and
   a differential amplifier feeding an output depending upon a difference between a level shifted signal from said level shifter and a predetermined reference voltage for leading an output thereof as a detection output,
   wherein said differential amplifier comprises at least one p-type Metal-Oxide Semiconductor Field-Effect Transistor (MOSFET).

2. The level detecting circuit as set forth in claim 1, wherein said voltage dividing resistor elements in said level shifting signal are connected in series between said reference power source voltage independent of said power source voltage to be supplied to said negative voltage level detector circuit, and said level shifted signal is led from one end of said series connected resistor elements.

3. The level detecting circuit as set forth in claim 1, wherein said level shifting means performs level shifting of said input signal so that a voltage level of said input signal becomes said predetermined reference voltage at a predetermined voltage level.

4. The level detecting circuit as set forth in claim 1, wherein said differential amplifier includes a pair of transistors forming a differential pair and a current mirror circuit to be a load for said pair of transistors, and said detection output is led from a junction between said transistors and said current mirror circuit.

5. The level detecting circuit as set forth in claim 4, wherein said differential amplifier further includes a constant current source, and said pair of transistors are provided between said constant current source and said current mirror circuit.

6. The level detecting circuit as set forth in claim 4, wherein said differential amplifier includes a third transistor to be a constant current source to be controlled to ON condition by a constant voltage independent of said power source voltage supplied to said negative voltage level detection circuit, said pair of transistors are provided between said third transistor and said current mirror circuit.

7. The level detecting circuit as set forth in claim 1, wherein said predetermined reference voltage is equal to a grounding potential.

8. The level detecting circuit as set forth in claim 2, wherein said voltage dividing resistor elements comprise a polycrystalline silicon.

9. The level detecting circuit as set forth in claim 2, wherein said voltage dividing resistor elements comprise a combination of MOSFETs.

10. The level detecting circuit as set forth in claim 1, wherein said differential amplifier receives a constant voltage/current at a source of said at least one p-type MOSFET.

11. A level detecting circuit comprising:
    level shifting means for performing predetermined level shifting of a voltage level of an input signal input from a negative voltage generating circuit, with a resistance type potential division by voltage dividing resistor elements using a reference power source voltage independent of a power source voltage to be supplied to said negative voltage level detection circuit;
    a differential amplifier feeding an output depending upon a difference between a level shifted signal from said level shifter and a predetermined reference voltage for leading an output thereof as a detection output, said differential amplifier includes a pair of transistors forming a differential pair and a current mirror circuit to be a load for said pair of transistors, and said detection output is lead from a junction between said transistors and said current mirror circuit;

a third transistor to be a constant current source to be controlled to ON condition by a constant voltage independent of said power source voltage supplied to said negative voltage level detection circuit, said pair of transistors are provided between said third transistor and said current mirror circuit; and a fourth transistor, which is turned ON depending upon the output of said third transistor, in parallel with said third transistor.

12. The level detecting circuit as set forth in claim 11, wherein said fourth transistor comprises a p-type MOSFET, said fourth transistor providing a constant current source.

13. The level detecting circuit as set forth in claim 11, wherein said fourth transistor is connected in parallel with said third transistor.

14. A level detecting circuit comprising:

level shifting means for performing predetermined level shifting of a voltage level of an input signal input from a negative voltage generating circuit, with a resistance type potential division by voltage dividing resistor elements using a reference power source voltage independent of a power source voltage to be supplied to said negative voltage level detection circuit;

a differential amplifier feeding an output depending upon a difference between a level shifted signal from said level shifter and a predetermined reference voltage for leading an output thereof as a detection output, said differential amplifier includes a pair of transistors forming a differential pair and a current mirror circuit to be a load for said pair of transistors, and said detection output is lead from a junction between said transistors and said current mirror circuit; and logical level transforming means for transforming said detection output into a complementary metal-oxide silicon (CMOS) logic level signal.

15. The level detecting circuit as set forth in claim 14, wherein said logical level transforming means comprises an inverter circuit constructed with a CMOS logic circuit.

* * * * *